(12) United States Patent
Tsai et al.

(10) Patent No.: US 7,009,204 B2
(45) Date of Patent: Mar. 7, 2006

(54) THIN FILM TRANSISTOR WITH SELF-ALIGNED INTRA-GATE ELECTRODE

(75) Inventors: Yaw-Ming Tsai, Taichung (TW); Hsiu-Chun Hsieh, Changhua (TW); Shih-Chang Chang, Hsinchu (TW); Chen-Ting Huang, Taipei (TW); I-Wei Wu, Hsinchu (TW)

(73) Assignee: Toppoly Optoelectronics Corp., Chu-Nan (TW)

( * ) Notice: Subject to any disclaimer, the term of this patent is extended or adjusted under 35 U.S.C. 154(b) by 0 days.

(21) Appl. No.: 10/869,210

(22) Filed: Jun. 16, 2004

(65) Prior Publication Data

US 2005/0056838 A1 Mar. 17, 2005

(30) Foreign Application Priority Data

Sep. 15, 2003 (TW) ............................... 92125406 A (51) Int. Cl.
*H01L 29/04* (2006.01)
(52) U.S. Cl. ............................ 257/59; 257/72; 257/89; 257/106; 349/106; 349/138
(58) Field of Classification Search ................. 257/59, 257/72, 89, 106; 349/106, 138
See application file for complete search history.

(56) References Cited

U.S. PATENT DOCUMENTS 6,707,067 B1 * 3/2004 Zhong et al. .................. 257/59

* cited by examiner

*Primary Examiner*—Mai-Huong Tran (74) *Attorney, Agent, or Firm*—Madson & Metcalf (57) ABSTRACT

A thin film transistor for use in an active matrix liquid crystal display includes a substrate, a source and a drain regions, and at least a gate electrode. The substrate includes therein a plurality of intrinsic regions, at least one first doped region and two second doped regions. The first doped region is disposed between the plurality of intrinsic regions. The plurality of intrinsic regions are linked together to form a connection structure via the first doped region, and the two second doped regions are disposed at both ends of the connection structure, respectively. The source and the drain regions are coupled to the two second doped regions disposed at both ends of the connection structure, respectively. The gate electrode is disposed over the plurality of intrinsic regions, such that the periphery of each of the plurality of intrinsic regions and the periphery of a corresponding gate electrode are substantially aligned with each other.

20 Claims, 6 Drawing Sheets

THIN FILM TRANSISTOR WITH SELF-ALIGNED INTRA-GATE ELECTRODE

FIELD OF THE INVENTION

The present invention relates to a thin film transistor for use in an active matrix liquid crystal display (AM-LCD), and more particularly to a thin film transistor with a self-align intra-gate electrode.

BACKGROUND OF THE INVENTION

With increasing development, liquid crystal displays (LCDs) are widely used due to their advantages of small size, light weight, low driving voltage, low power consumption and good portability. The liquid crystal molecules of the liquid crystal displays are aligned in response to electrical filed changes, thereby controlling the brightness or darkness of the liquid crystal display.

According the production technologies, liquid crystal displays are typically classified into two major types, i.e. a passive matrix liquid crystal display (PM-LCD) and an active matrix liquid crystal display (AM-LCD). In 1970s, the PM-LCDs have been applied in watches and portable calculators. However, since such LCDs have disadvantages of insufficient brightness, narrow viewing angle and low response speed, their applications are restricted. Since the active matrix liquid crystal display (AM-LCD) can drive unitary pixel without influencing adjacent pixels and have good color quality and quicker response speed, they are widely used as liquid crystal displays of digital still cameras, liquid crystal projectors, cellular phones, notebooks, etc. So far, the active matrix liquid crystal displays are relatively popular.

The active matrix liquid crystal displays are generally classified as two major types: diode-structured LCDs and transistor-structured LCDs. Thin film transistor liquid crystal display (TFT-LCD) is one of the transistor-structured LCDs. As is known, TFTs (thin film transistors) are widely used as switching elements for controlling respective pixels of a TFT liquid crystal display (TFT-LCD) so as to achieve good image quality such as high contrasts, wide viewing angles, rapid response, low cost, etc.

Figure 1:
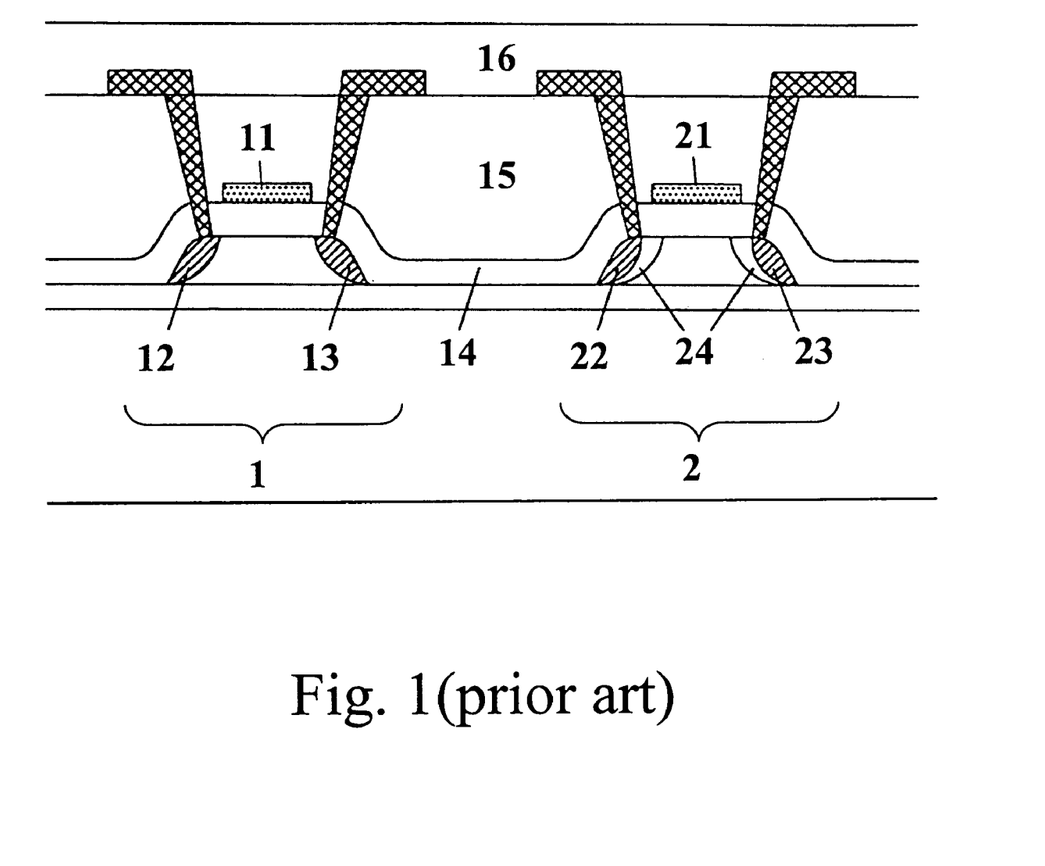
FIG. 1 is a cross-sectional view illustrating a conventional three-terminal TFT with a top-gate typed structure.

The thin film transistors used in the active matrix liquid crystal display is usually a three-terminal TFT with a top-gate typed structure. As shown in FIG. 1, the three-terminal TFT with a top-gate structure comprises a P-channel TFT 1 and an N-channel TFT 2, wherein the N-channel TFT 2 has a lightly doped drain (LDD) region 24. The source region 12 and the drain region 13 of the P-channel TFT 1 are implemented by implanting boron thereinto. Whereas, the source region 22 and the drain region 23 of the N-channel TFT 2 are implemented by implanting phosphorous thereinto. The LDD regions 24 of the N-channel TFT 2 are useful to minimize current leakage. For example, the gate electrodes 11 and 21 are made of molybdenum/tungsten alloy, the gate oxide layer 14 and the insulator layer 15 are made of silicon dioxide, and the conductive lines are made of pure aluminum. Afterward, the resulting structure is covered with a passivation layer 16, which is made of nitride silicon.

As a result of miniaturization, the channel between the source and drain regions in each TFT will become narrower and narrower. Some undesirable effects such as "hot electron effect", "breakdown voltage" and "impact ionization" are rendered in the vicinity of the drain region 23. Although the LDD regions 24 of the N-channel TFT 2 can reduce the undesirable effects, some additional problems occur. For example, a photo-misalignment problem occurs because at least two masks and at least two ion-implanting steps are required for forming the LDD regions 24. Such photo-misalignment problem impairs electrical properties of the TFT and thus image quality of the liquid crystal display.

SUMMARY OF THE INVENTION

It is an aspect of the present invention to provide a thin film transistor for use in an active matrix liquid crystal display (AM-LCD) so as to minimize the problem of photo-misalignment.

It is another aspect of the present invention to provide a thin film transistor capable of providing associated functions of LDD regions so as to provide good image characteristics of the active matrix liquid crystal display (AM-LCD).

It is another aspect of the present invention to provide a thin film transistor formed by self-align process, in which the gate characteristic length of the thin film transistor can be shortened according to the features of the components, thereby increasing aperture ratio of the pixel and reducing surface reflection of the polysilicon layer.

In accordance with a first aspect of the present invention, there is provided a thin film transistor for use in an active matrix liquid crystal display. The thin film transistor comprises a substrate, a source region and a drain region, and at least a gate electrode. The substrate comprises therein a plurality of intrinsic regions, at least one first doped region and two second doped regions. The first doped region is disposed between the plurality of intrinsic regions. The plurality of intrinsic regions are linked together to form a connection structure via the first doped region, and the two second doped regions are disposed at both ends of the connection structure, respectively. The source and the drain regions are coupled to the two second doped regions disposed at both ends of the connection structure, respectively. The at least one gate electrode is disposed over the plurality of intrinsic regions, such that the periphery of each of the plurality of intrinsic regions and the periphery of a corresponding gate electrode are substantially aligned with each other.

In one embodiment, the substrate comprises a polysilicon layer.

In one embodiment, the plurality of intrinsic regions, the first doped region and the second doped region are formed in the polysilicon layer.

In one embodiment, the first doped region and the second doped region are formed by implanting a first and a second dopant concentration of phosphorus thereinto, respectively. The second dopant concentration is greater than the first dopant concentration.

In one embodiment, the gate electrode is made of a material selected from a group consisting of molybdenum/tungsten alloy (MoW), chromium (Cr), aluminum (Al), molybdenum (Mo), titanium (Ti), tantalum (Ta) and copper (Cu).

In one embodiment, the thin film transistor further comprises a gate oxide layer between the intrinsic regions and the corresponding gate electrode. Preferably, the gate oxide layer is made of silicon dioxide.

In one embodiment, the gate electrode is arranged in a Π-shaped configuration, and the characteristic length of the gate electrode is less than 7 µm.

In one embodiment, the gate electrode is arranged in an L-shaped configuration, and the characteristic length of the gate electrode is less than 5 µm.

In one embodiment, the gate electrode is arranged in an I-shaped configuration, and the characteristic length of the gate electrode is less than 5 µm.

In one embodiment, the gate electrode is arranged in an E-shaped configuration, and the characteristic length of the gate electrode is less than 7 µm.

In accordance with a first aspect of the present invention, there is provided a thin film transistor. The thin film transistor comprises a substrate, a source and a drain region, and at least one gate electrode. The substrate comprises therein N intrinsic regions, (N−1) first doped regions and two second doped regions. The (N−1) first doped region is disposed between the N intrinsic regions in a staggered form, and the two second doped regions is disposed outside the first one and the Nth one of the N intrinsic regions. N is an integer larger than or equal to 2. The source and the drain regions are coupled to the two second doped regions, respectively. The at least one gate electrode is disposed over the N intrinsic regions, such that the periphery of each of the N intrinsic regions and the periphery of a corresponding gate electrode are substantially aligned with each other.

The above aspects and advantages of the present invention will become more readily apparent to those ordinarily skilled in the art after reviewing the following detailed description and accompanying drawings, in which:

DETAILED DESCRIPTION OF THE PREFERRED EMBODIMENT

The present invention relates to a thin film transistor for use in an active matrix liquid crystal display. The present invention will now be described more specifically with reference to the following embodiments relating to a thin film transistor. However, the following descriptions of embodiments of this invention are presented herein for purpose of illustration and description only; it is not intended to be exhaustive or to be limited to the precise form disclosed. For example, the concept of the present invention can be applied to other thin film transistors.

Figure 2:
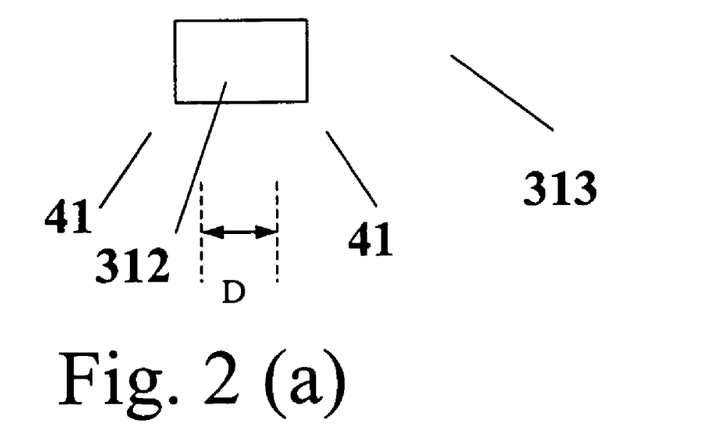
FIGS. 2(a) and 2(b) are top view and cross-sectional view illustrating a thin film transistor for use in an active matrix liquid crystal display according to a first embodiment of the present invention, respectively.

FIGS. 2(a) and 2(b) are top view and cross-sectional view illustrating a thin film transistor for use in an active matrix liquid crystal display according to a first embodiment of the present invention, respectively. The thin film transistor of the present invention comprises a substrate 31. In the substrate 31, there is provided a plurality of intrinsic regions 311, at least one first doped region 312 (which can be n-doped regions) and two second doped regions 313. The first doped region 312 is disposed between the intrinsic regions 311. The intrinsic regions 311 are linked together to form a connection structure via the first doped region 312. The two second doped regions 313 are disposed at both ends of the connection structure, respectively. Furthermore, this thin film transistor further comprises a source region 51 and a drain region 52, which are coupled to the two second doped regions 313 disposed at both ends of the connection structure, respectively. This thin film transistor further comprises at least one gate electrode 41 disposed over the intrinsic regions 311, such that the periphery of each intrinsic region 311 and the periphery of a corresponding gate electrode 41 are substantially aligned with each other.

Figure 3:
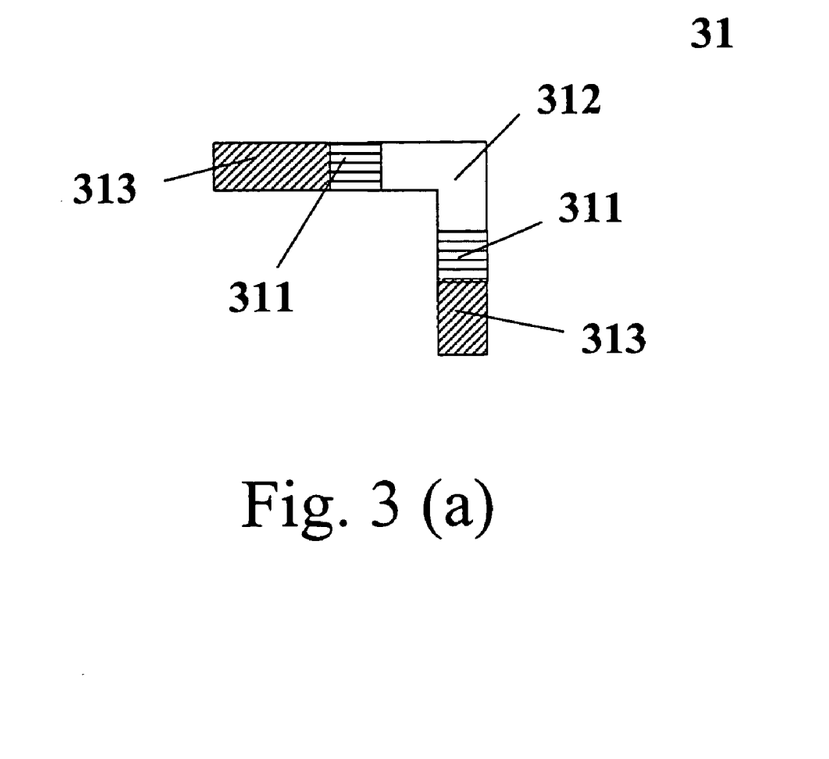
FIGS. 3(a) and 3(b) are schematic views illustrating portions of a thin film transistor according to a second embodiment of the present invention.

FIGS. 3(a) and 3(b) are schematic views illustrating a thin film transistor according to a second embodiment of the present invention. In FIG. 3(a), the relative locations of the intrinsic regions 311, the first doped region 312 and the second doped regions 313 are shown. The intrinsic regions 311, the first doped region 312 and the second doped regions 313 are arranged in an inverse L-shaped configuration. In other words, the first doped region 312 comprises two portions in vertical arrangement to each other. The intrinsic regions 311 are linked together to form a connection structure via the first doped region 312. The two second doped regions 313 are disposed at both ends of the connection structure, respectively. Furthermore, this thin film transistor further comprises a source region and a drain region (not shown), which are coupled to the two second doped regions 313 disposed at both ends of the connection structure, respectively. In FIG. 3(b), the gate electrode 41 is arranged in an L-shaped configuration and disposed over the intrinsic regions 311, such that the periphery of each intrinsic region 311 and the periphery of a corresponding gate electrode 41 are substantially aligned with each other. In addition, the first doped region 312 and the second doped region 313 are formed by implanting a first and a second dopant concentrations of phosphorus thereinto, respectively. The second dopant concentration is greater than the first dopant concentration. In the above embodiment, the gate electrode 41 can be also made of molybdenum/tungsten alloy (MoW), chromium (Cr), aluminum (Al), molybdenum (Mo), titanium (Ti), tantalum (Ta) or copper (Cu).

Figure 4:
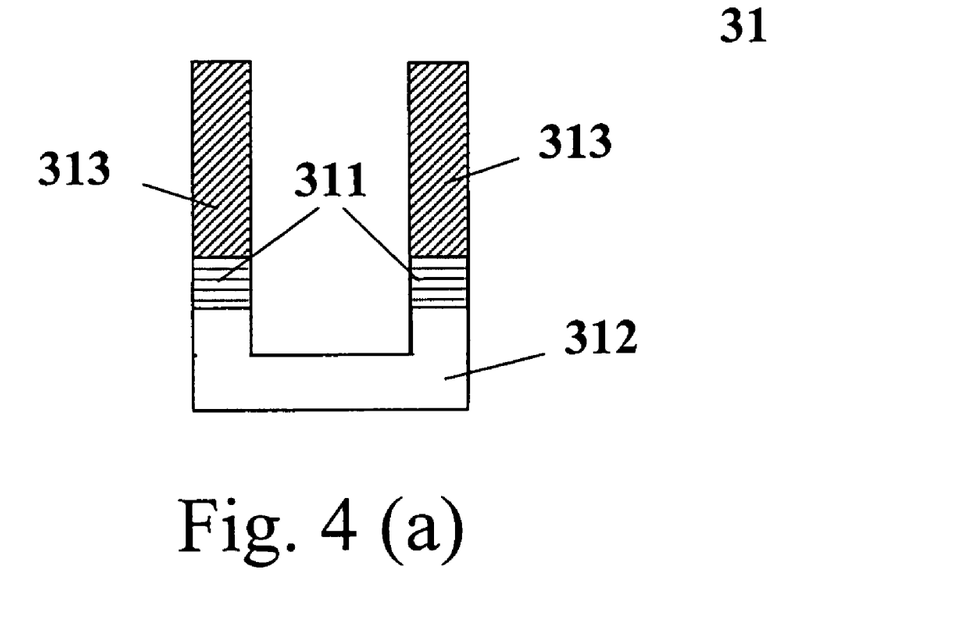
FIGS. 4(a) and 4(b) are schematic views illustrating portions of a thin film transistor according to a third embodiment of the present invention.

A third embodiment of the present invention can be seen in FIGS. 4(a) and 4(b). In FIG. 4(a), the relative locations of the intrinsic regions 311, the first doped region 312 and the second doped regions 313 are shown. The intrinsic regions 311, the first doped region 312 and the second doped regions 313 are arranged in approximately a U-shaped configuration. In other words, the first doped region 312 is arranged in approximately a U-shaped configuration. The intrinsic regions 311 are linked together to form a connection structure via the first doped region 312. The two second doped regions 313 are disposed at both ends of the connection structure, respectively. Furthermore, this thin film transistor further comprises a source region and a drain region (not shown), which are coupled to the two second doped regions 313 disposed at both ends of the connection structure, respectively. In FIG. 4(b), the gate electrode 41 is arranged in an I-shaped configuration and disposed over the intrinsic regions 311, such that the periphery of each intrinsic region 311 and the periphery of a corresponding gate electrode 41 are substantially aligned with each other.

Figure 5:
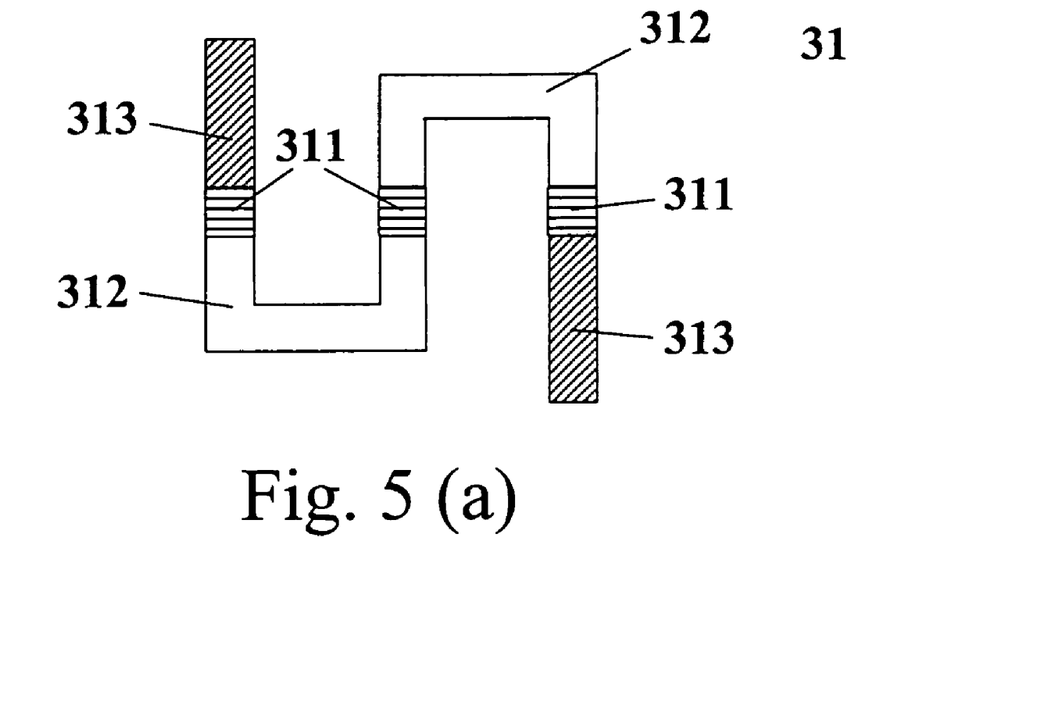
FIGS. 5(a) and 5(b) are schematic views illustrating portions of a thin film transistor according to a fourth embodiment of the present invention.
Figure 6:
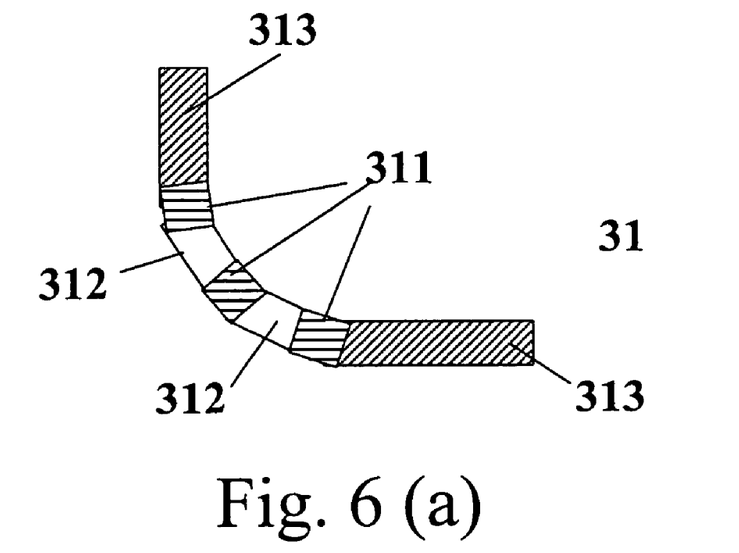
FIGS. 6(a) and 6(b) are schematic views illustrating portions of a thin film transistor according to a fifth embodiment of the present invention.

FIGS. 5 and 6 are schematic views illustrating two thin film transistors according to a fourth and a fifth embodiments of the present invention, respectively. The thin film transistor for each of the two embodiments comprises a substrate 31. In the substrate 31, there is provided N intrinsic regions 311, (N−1) first doped region 312 and two second doped regions 313, wherein N is an integer larger than or equal to 2. The (N−1) first doped regions 312 are disposed between the N intrinsic regions 311 in a staggered form. The two second doped regions 313 are disposed outside the first one and the Nth one of the N intrinsic regions 311. Furthermore, this thin film transistor further comprises a source region and a drain region (not shown), which are coupled to the two second doped regions 313 disposed at both ends of the connection structure, respectively. The gate electrode 41 is disposed over the intrinsic regions 311, such that the periphery of each intrinsic region 311 and the periphery of a corresponding gate electrode 41 are substantially aligned with each other. The thin film transistor with a self-align intra-gate electrode is produced accordingly.

In the thin film transistor of FIGS. 5(a) and 5(b), N=3. In other words, this thin film transistor comprises three intrinsic regions 311, two first doped region 312 and two second doped regions 313. As shown in FIG. 5(a), the intrinsic regions 311, the first doped region 312 and the second doped regions 313 are arranged in an S-shaped configuration. The two first doped regions 312 are disposed between the three intrinsic regions 311 in a staggered form. The two second doped regions 313 are disposed outside the first one and the third one of the three intrinsic regions 311. Furthermore, this thin film transistor further comprises a source region and a drain region (not shown), which are coupled to the two second doped regions 313 disposed at both ends of the connection structure, respectively. In FIG. 5(b), the gate electrode 41 is arranged in an I-shaped configuration and disposed over the intrinsic regions 311, such that the periphery of each intrinsic region 311 and the periphery of a corresponding gate electrode 41 are substantially aligned with each other.

In the thin film transistor of FIGS. 6(a) and 6(b), N is also equal to 3. In other words, this thin film transistor comprises three intrinsic regions 311, two first doped region 312 and two second doped regions 313. As shown in FIG. 6(a), the intrinsic regions 311, the first doped region 312 and the second doped regions 313 are arranged in a curved form. The two first doped regions 312 are disposed between the three intrinsic regions 311 in a staggered form. The two second doped regions 313 are disposed outside the first one and the third one of the three intrinsic regions 311. Furthermore, this thin film transistor further comprises a source region and a drain region (not shown), which are coupled to the two second doped regions 313 disposed at both ends of the connection structure, respectively. In FIG. 6(b), the gate electrode 41 is arranged in an E-shaped configuration and disposed over the intrinsic regions 311, such that the periphery of each intrinsic region 311 and the periphery of a corresponding gate electrode 41 are substantially aligned with each other.

The operation principles of the above-mentioned embodiments are similar except for the number, the arrangement and the relative locations of the intrinsic regions 311, the first doped region 312 and the second doped regions 313. Depending on the number, the arrangement and the relative locations of the intrinsic regions 311, the first doped region 312 and the second doped regions 313, the gate electrode 41 is correspondingly arranged in a Π-shaped, an L-shaped, an I-shaped or an E-shaped configuration. It is of course that the structure of the gate electrode can be varied as the relative regions in the polysilicon layers are changed.

From the above description, it is understood that thin film transistor of the present invention is provided by introducing an intra-gate structure to obtain comparable electrical properties of the LDD regions, and integrating with the procedures for forming the P-channel TFT. After the intra-gate structure is introduced into the NMOS of the N-channel transistor, a self-aligning process is performed. When the pixel and the driving circuit are re-designed, since the PMOS of the P-channel transistor has been formed by a self-aligning process, both of these self-aligning process can be integrated into a total self-align process. Moreover, the gate characteristic length of the thin film transistor can be shortened depending on the features of the component, thereby increasing aperture ratio of the pixel and reducing surface reflection of the polysilicon layer. The gate characteristic length of the thin film transistor for the above embodiments is indicated as "D".

The characteristic length D of the gate electrode 41 in the above embodiment will be varied as the configuration of the gate electrode 41 is changed. For example, when the gate electrode 41 is arranged in a Π-shaped or an E-shaped configuration, as shown in FIGS. 2(a) and 6(b), the characteristic length of the gate electrode 41 is less than 7 $\mu$m. Whereas, when the gate electrode is arranged in an L-shaped or an I-shaped configuration, as shown in FIGS. 3(b), 4(b) and 5(b), the characteristic length of the gate electrode 41 is less than 5 $\mu$m. Regardless of the configuration of the gate electrode 41 described above, the characteristic length D of the gate electrode 41 according to the present invention is less than the length of the conventional LDD structure.

Since the ployslicon layer for making the intrinsic regions 311, the first doped region 312 and the second doped regions 313 of the above embodiments is made of intrinsic polysilicon, the electrical resistance thereof is relatively high. This high electrical resistance requires a higher voltage (Vcom), such as >8V, applied on the storage capacitor (Cst), thereby increasing the charging amount of the storage capacitor (Cst) and allowing Cst/Clc>1.

While the invention has been described in terms of what is presently considered to be the most practical and embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A thin film transistor for use in an active matrix liquid crystal display, comprising:

a substrate comprising therein a plurality of intrinsic regions, at least one first doped region and two second doped regions, said first doped region being disposed between said plurality of intrinsic regions, wherein said plurality of intrinsic regions are linked together to form a connection structure via said first doped region, and said two second doped regions are disposed at both ends of said connection structure, respectively;

a source and a drain region coupled to said two second doped regions disposed at both ends of said connection structure, respectively; and at least one gate electrode disposed over said plurality of intrinsic regions, such that the periphery of each of said plurality of intrinsic regions and the periphery of a corresponding gate electrode are substantially aligned with each other.

2. The thin film transistor according to claim 1 wherein said substrate comprises a polysilicon layer.

3. The thin film transistor according to claim 2 wherein said plurality of intrinsic regions, said first doped region and said second doped region are formed in said polysilicon layer.

4. The thin film transistor according to claim 1 wherein said first doped region and said second doped region are formed by implanting a first and a second dopant concentrations of phosphorus thereinto, respectively.

5. The thin film transistor according to claim 4 wherein said second dopant concentration is greater than said first dopant concentration.

6. The thin film transistor according to claim 1 further comprising a gate oxide layer between said intrinsic regions and said corresponding gate electrode.

7. The thin film transistor according to claim 1 wherein said gate electrode is arranged in a Π-shaped configuration.

8. The thin film transistor according to claim 7 wherein the characteristic length of said gate electrode is less than 7 μm.

9. The thin film transistor according to claim 1 wherein said gate electrode is arranged in an L-shaped configuration.

10. The thin film transistor according to claim 9 wherein the characteristic length of said gate electrode is less than 5 μm.

11. The thin film transistor according to claim 1 wherein said gate electrode is arranged in an I-shaped configuration.

12. The thin film transistor according to claim 11 wherein the characteristic length of said gate electrode is less than 5 μm.

13. The thin film transistor according to claim 1 wherein said gate electrode is arranged in an E-shaped configuration.

14. The thin film transistor according to claim 13 wherein the characteristic length of said gate electrode is less than 7 μm.

15. A thin film transistor, comprising:
a substrate comprising therein N intrinsic regions, (N−1) first doped regions and two second doped regions, said (N−1) first doped regions being disposed between said N intrinsic regions in a staggered form, said two second doped regions being disposed outside the first one and the Nth one of said N intrinsic regions, wherein N is an integer larger than or equal to 2;
a source and a drain regions coupled to said two second doped regions, respectively; and
at least one gate electrode disposed over said N intrinsic regions, such that the periphery of each of said N intrinsic regions and the periphery of a corresponding gate electrode are substantially aligned with each other.

16. The thin film transistor according to claim 15 wherein said substrate is a substrate having a polysilicon layer.

17. The thin film transistor according to claim 15 wherein said first doped region and said second doped region are formed by implanting a first and a second dopant concentrations of phosphorus thereinto, respectively.

18. The thin film transistor according to claim 17 wherein said second dopant concentration is greater than said first dopant concentration.

19. The thin film transistor according to claim 15 wherein said gate electrode is arranged in a Π-shaped, an L-shaped, an I-shaped or an E-shaped configuration.

20. The thin film transistor according to claim 19 wherein the characteristic length of said gate electrode is less than 7 μm when said gate electrode is arranged in a Π-shaped or an E-shaped configuration, and the characteristic length of said gate electrode is less than 5 μm when said gate electrode is arranged in an L-shaped or an I-shaped configuration.

* * * * *